(12) United States Patent
Konishi et al.

(10) Patent No.: US 10,727,360 B2
(45) Date of Patent: Jul. 28, 2020

(54) PHOTOELECTRIC CONVERSION DEVICE AND METHOD FOR MANUFACTURING SAME

(71) Applicant: KANEKA CORPORATION, Osaka (JP)

(72) Inventors: Katsunori Konishi, Osaka (JP); Kunta Yoshikawa, Osaka (JP); Hayato Kawasaki, Osaka (JP); Kunihiro Nakano, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/560,505

(22) Filed: Sep. 4, 2019

(65) Prior Publication Data

US 2019/0393370 A1 Dec. 26, 2019

Related U.S. Application Data

(60) Division of application No. 16/002,310, filed on Jun. 7, 2018, which is a continuation of application No. PCT/JP2016/079353, filed on Oct. 3, 2016.

(30) Foreign Application Priority Data

Dec. 7, 2015 (JP) .................................. 2015-238995

(51) Int. Cl.
*H01L 31/18* (2006.01)
*H01L 31/072* (2012.01)
(Continued)

(52) U.S. Cl.
CPC .... *H01L 31/022441* (2013.01); *H01L 31/072* (2013.01); *H01L 31/0747* (2013.01);
(Continued)

(58) Field of Classification Search
CPC ................. H01L 31/0747; H01L 31/18; H01L 31/022441; H01L 31/072; H01L 31/1804
See application file for complete search history.

(56) References Cited

U.S. PATENT DOCUMENTS

| 8,163,638 B2 * | 4/2012 | De Ceuster ..... H01L 31/022433 438/558 |
| 2005/0172996 A1 * | 8/2005 | Hacke ............. H01L 31/022458 136/256 |

(Continued)

*Primary Examiner* — Golam Mowla
(74) *Attorney, Agent, or Firm* — Osha Liang LLP

(57) ABSTRACT

A method for manufacturing a photoelectric conversion device, wherein the photoelectric conversion device includes a semiconductor substrate having a first conductivity-type region, a second conductivity-type region, and a boundary region on a first principal surface of a semiconductor substrate, the boundary region being in contact with and separating the first conductivity-type region and the second conductivity-type region, the method including: stacking a second conductivity-type semiconductor layer over the second conductivity-type region and the boundary region on the first principal surface of the semiconductor substrate; stacking an insulating layer over the second conductivity-type semiconductor layer in the boundary region; stacking a first conductivity-type semiconductor layer over the first conductivity-type region on the first principal surface of the semiconductor substrate and on the insulating layer; stacking an electrode layer on the first conductivity-type semiconductor layer and the second conductivity-type semiconductor layer; and forming a separation groove that separates the electrode layer.

6 Claims, 6 Drawing Sheets

(51) Int. Cl.
*H01L 31/0224* (2006.01)
*H01L 31/0747* (2012.01)

(52) U.S. Cl.
CPC .......... *H01L 31/18* (2013.01); *H01L 31/1804* (2013.01); *Y02E 10/50* (2013.01); *Y02P 70/521* (2015.11)

(56) References Cited

U.S. PATENT DOCUMENTS

| | | | | |
|---|---|---|---|---|
| 2009/0286393 | A1* | 11/2009 | Mathew | H01L 31/1804 438/655 |
| 2009/0288704 | A1* | 11/2009 | Borden | H01L 31/062 136/255 |
| 2009/0314341 | A1* | 12/2009 | Borden | H01L 31/022441 136/256 |
| 2014/0020752 | A1* | 1/2014 | Arimoto | H01L 31/022441 136/256 |
| 2014/0020756 | A1* | 1/2014 | Goto | H01L 31/022441 136/256 |

* cited by examiner

PHOTOELECTRIC CONVERSION DEVICE AND METHOD FOR MANUFACTURING SAME

TECHNICAL FIELD

One or more embodiments of the present invention relate to a photoelectric conversion device and a method for manufacturing the same.

BACKGROUND

In a typical solar cell, a p-n junction is formed on the light-receiving side of a semiconductor substrate such as a crystalline silicon substrate, and a light-receiving-side electrode for collecting photocarrier is formed on the p-n junction. For improving the photocarrier collection efficiency of the entire light-receiving surface while suppressing shadowing loss, the light-receiving-side electrode of the solar cell is formed in a pattern shape. However, since there is a trade-off relationship between shadowing loss reduction and carrier collection efficiency improvement, enhancement of conversion efficiency by adjusting pattern shape of the light-receiving-side electrode is inherently limited.

In view of these situations, a back-contact solar cell has been proposed in which a p-type semiconductor region and a p-side electrode, and an n-type semiconductor region and an n-side electrode are disposed on the back side (a surface opposite to a light-receiving surface) of a semiconductor substrate. Back-contact solar cells have no electrode on the light-receiving side, and therefore the amount of light captured in a semiconductor substrate is increased, so that high conversion efficiency can be achieved.

In a back-contact solar cell, it is necessary to pattern a semiconductor layer and an electrode so that leakage does not occur between a p-type semiconductor region and an n-type semiconductor region on the back side. In general, patterning is performed by forming a separation groove at a boundary portion between a p-type semiconductor region and an n-type semiconductor region. However, when the width of a separation groove is increased for reliably preventing leakage, the areas of a semiconductor region and an electrode that contribute to power generation are reduced, so that conversion characteristics cannot be sufficiently improved.

In view of such a problem, Patent Document 1 suggests forming a region (overlapping region) where a p-type layer and an n-type layer overlap each other. In the overlapping region, an insulating layer is disposed between the p-type layer and the n-type layer to prevent leakage between the p-type layer and the n-type layer. In the back-contact solar cell in Patent Document 1, the p-type layer and the n-type layer are separated from each other by the insulating layer disposed in the overlapping region, and an electrode separation groove is disposed near the center of the overlapping region to electrically separate the p-side electrode and the n-side electrode.

PRIOR ART DOCUMENT

Patent Document

Patent Document 1: WO 2012/132729

There is room for enhancement of the efficiency of a back-contact solar cell by improving a method for patterning semiconductor layers and electrodes. Specifically, it is required to enhance photocarrier extraction efficiency by forming a semiconductor layer and an electrode with a larger area to expand a region that contributes to power generation while reducing leakage between a p-type layer and an n-type layer.

One or more embodiments of the present invention provide a back-contact photoelectric conversion device capable of expanding a region that contributes to power generation while reducing a leak current, and some embodiments provide a method for manufacturing the photoelectric conversion device.

SUMMARY

In one or more embodiments, a photoelectric conversion device of the present invention includes a first conductivity-type region, a second conductivity-type region, and a boundary region on one principal surface of a semiconductor substrate. In one or more embodiments the boundary region is in contact with each of the first conductivity-type region and the second conductivity-type region so that the first and second conductivity-type regions are separated from each other. The photoelectric conversion device of one or more embodiments may include, on one principal surface of the semiconductor substrate, a first conductivity-type semiconductor layer disposed over the entire first conductivity-type region and extend over the boundary region, a second conductivity-type semiconductor layer disposed over the entire second conductivity-type region and extending over the boundary region, a first electrode disposed over the entire first conductivity-type region and extending over the boundary region, a second electrode disposed over the second conductivity-type region, and an insulating layer disposed over the entire boundary region. The first conductivity-type semiconductor layer and the second conductivity-type semiconductor layer have opposite conductivity-types. In other words, one of the semiconductor layers is an n-type, and the other is a p-type.

In the first conductivity-type region of one or more embodiments, the first conductivity-type semiconductor layer and the first electrode are stacked on the semiconductor substrate. In the second conductivity-type region of one or embodiments, the second conductivity-type semiconductor layer and the second electrode are stacked on the semiconductor substrate. In the boundary region of one or more embodiments, the second conductivity-type semiconductor layer, the insulating layer, the first conductivity-type semiconductor layer and the first electrode are stacked on the semiconductor substrate. In the insulating layer, a lateral surface on the first conductivity-type region side is covered with the first conductivity-type semiconductor layer, and a lateral surface on the second conductivity-type region side is not covered with any of the first conductivity-type semiconductor layer and the second conductivity-type semiconductor layer.

In one or more embodiments, the second electrode is not disposed over a region where the first conductivity-type semiconductor layer is disposed, and thus the first electrode and the second electrode are separated from each other. For example, the first electrode and the second electrode may be separated from each other by not disposing the second electrode in the boundary region.

In some embodiments, a first intrinsic semiconductor layer is stacked between the semiconductor substrate and the first conductivity-type semiconductor layer, and a second intrinsic semiconductor layer is stacked between the semiconductor substrate and the second conductivity-type semiconductor layer. Preferably, in one or more embodiments, the entire region, except a peripheral edge, of one principal surface of the semiconductor substrate is covered with any of the first intrinsic semiconductor layer and the second intrinsic semiconductor layer.

Preferably, in one or more embodiments, the first conductivity-type region and the second conductivity-type region are arranged alternately along a first direction on one principal surface of the photoelectric conversion device.

In one or more embodiments, it is preferable that, along the first direction, a width $D_{10}$ of the first electrode, a width $D_{11}$ of the first conductivity-type region and a width $D_{20}$ of the second electrode satisfy the relationship of $D_{11} \leq D_{20} \leq D_{10}$. The width of the first electrode disposed overlapping with the first conductivity-type region may be preferably 1.5 to 15 times the total width of first electrodes disposed overlapping with the boundary region. The width of a portion where the first electrode is formed on the boundary region is preferably larger than the width of a portion where the first electrode is not formed.

Preferably, in one or more embodiments, the first electrode and the second electrode are separated by a separation groove extending along a second direction perpendicular to the first direction. For example, the separation groove is formed on a portion including a second conductivity-type region-side end portion of the first conductivity-type semiconductor layer disposed over the boundary region. By forming the separation groove on the end portion on the second conductivity-type region-side, the lateral surface of the first conductivity-type semiconductor layer is not covered with the electrode. In one embodiment, the separation groove separating the first electrode and the second electrode is formed to extend over the boundary region and the second conductivity-type region. The width of the separation groove overlapping with the second conductivity-type region may be preferably 50 µm or less. The width of the separation groove overlapping with the second conductivity-type region may be preferably smaller than the width of the separation groove on the boundary region.

In one or more embodiments of a method for manufacturing a photoelectric conversion device according to the present invention, a second conductivity-type semiconductor layer is stacked on a second conductivity-type region and a boundary region on one principal surface of a semiconductor substrate, an insulating layer is stacked on the second conductivity-type semiconductor layer in the boundary region, a first conductivity-type semiconductor layer is stacked on a first conductivity-type region and the insulating layer in the boundary region, and an electrode layer is stacked on the first conductivity-type semiconductor layer and the second conductivity-type semiconductor layer. Thereafter, a separation groove for separating the electrode layer is formed. By forming the separation groove on a portion including a second conductivity-type region-side end portion of the first conductivity-type semiconductor layer on the boundary region, the electrode layer is separated into a first electrode disposed over the entire first conductivity-type region and extending over the boundary region, and a second electrode disposed over the second conductivity-type region and separated from the first electrode.

In a photoelectric conversion device of one or more embodiments of the present invention, it is possible to suppress leakage between semiconductor layers and between electrodes, and the semiconductor layers and the electrodes are formed with a large area. Therefore, a region that can contribute to power generation is wide, leading to excellent photocarrier extraction efficiency.

DETAILED DESCRIPTION OF THE EMBODIMENTS

Figure 1:
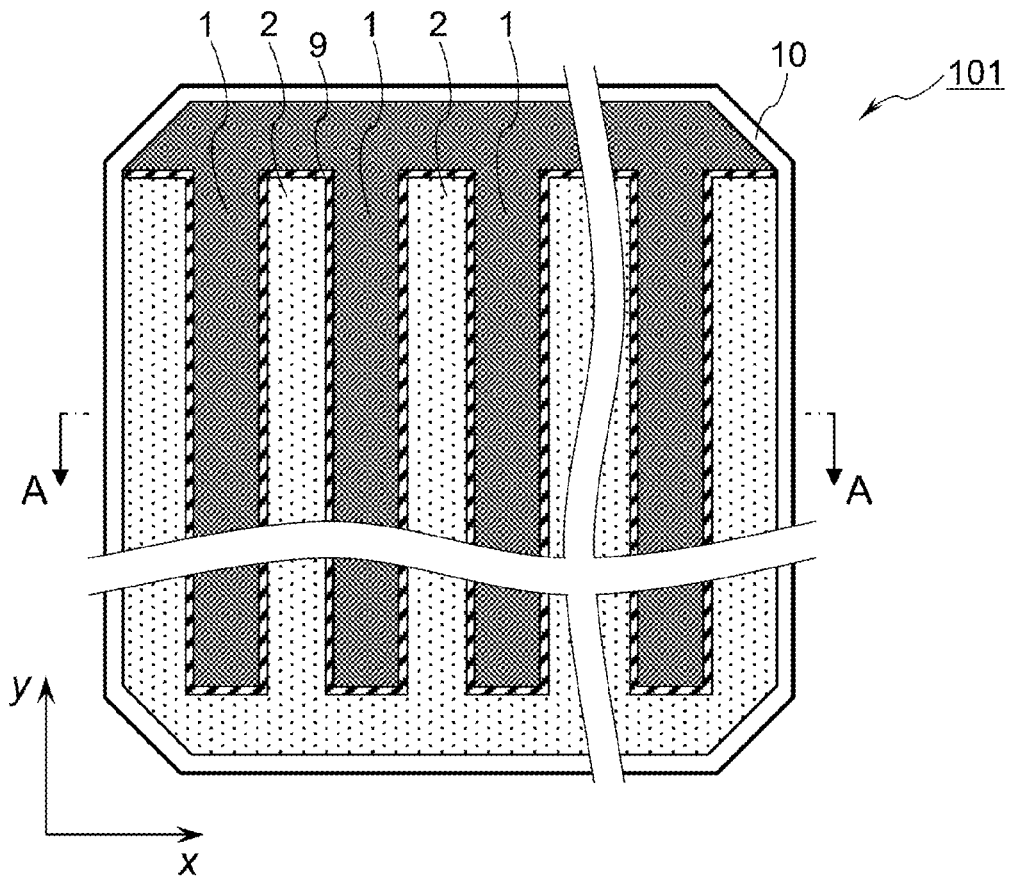
FIG. 1 is a plan view of a photoelectric conversion device of one embodiment as seen from the back side.
Figure 2:
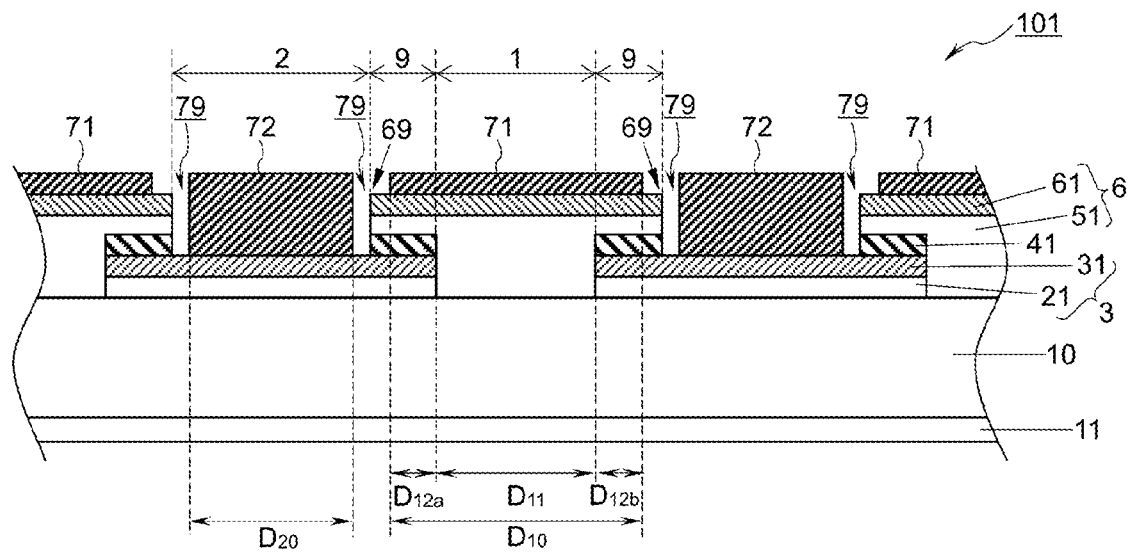
FIG. 2 is a sectional view taken along line A-A in FIG. 1.

FIG. 1 is a plan view of a back-contact photoelectric conversion device 101 according to one or more embodiments of the present invention viewed from a back side (side opposite to a light-receiving surface). FIG. 2 is a sectional view taken along line A-A in FIG. 1. As shown in FIG. 1, the photoelectric conversion device 101 of one or more embodiments of the present invention includes a first conductivity-type region 1 and a second conductivity-type region 2 on the back side of a semiconductor substrate 10. Preferably, in some embodiments, the first conductivity-type region 1 and the second conductivity-type region 2 are formed in the shape of interdigitated comb teeth, or a stripe shape, and arranged alternately along a first direction (x direction).

Preferably, in one or more embodiments, the first conductivity-type region and the second conductivity-type region are gaplessly disposed over the entire region except the peripheral edge of conductive semiconductor substrate. A boundary region 9 is arranged between the first conductivity-type region 1 and the second conductivity-type region 2. The boundary region 9 is formed in conformity to the pattern shapes of the first conductivity-type region and the second conductivity-type region. The boundary region 9 is in contact with each of the first conductivity-type region 1 and the second conductivity-type region 2, so that the regions are separated from each other. The boundary region 9 is arranged at a boundary portion between the first conductivity-type region 1 and the second conductivity-type region 2. Thus, when the first conductivity-type region 1 and the second conductivity-type region are arranged so as to extend along a second direction (y direction) perpendicular to the first direction, the boundary region 9 is also arranged so as to extend along the second direction as shown in FIG. 1.

The semiconductor substrate 10 of one or more embodiments is a semiconductor substrate of p-type or n-type conductivity. Examples of the semiconductor substrate include silicon substrates of single-crystalline silicon, polycrystalline silicon or the like, and semiconductor substrates of germanium, gallium nitride or the like. In the photoelectric conversion device of one or more embodiments of the present invention, it is preferable to use a p-type or n-type single-crystalline silicon substrate as the semiconductor substrate. The semiconductor substrate 10 functions as a photoelectric conversion layer that absorbs incident light from the light-receiving side to generate photocarriers.

Preferably, in one or more embodiments a passivation layer 11 is disposed on the light-receiving side of the silicon substrate 10. The passivation layer 11 disposed on the light-receiving side of the silicon substrate 10 may be preferably an intrinsic (i-type) amorphous silicon thin-film. For effectively passivating the silicon substrate, the thickness of the passivation layer 11 may be preferably about 1 to 20 nm. On the passivation layer, a silicon-based thin-film of conductivity-type (p-type or n-type), an anti-reflection layer or the like may be disposed.

In one or more embodiments a second conductivity-type semiconductor layer 31, an insulating layer 41 and a first conductivity-type semiconductor layer 61 are disposed on the back surface of the silicon substrate 10, and these layers are patterned to form the first conductivity-type region 1, the second conductivity-type region 2 and the boundary region 9. The first conductivity-type semiconductor layer 61 and the second conductivity-type semiconductor layer 31 have opposite conductivity types. That is, when the first conductivity-type semiconductor layer 61 has p-type conductivity, the second conductivity-type semiconductor layer 31 has n-type conductivity, and when the first conductivity-type semiconductor layer 61 has n-type conductivity, the second conductivity-type semiconductor layer 31 has p-type conductivity. In the following description, the first conductivity-type is an n-type, and the second conductivity-type is a p-type.

In one or more embodiments the n-type layer 61 as a first conductivity-type semiconductor layer is disposed over the entire first conductivity-type region (n-type region) 1, and extending over the boundary region 9. The p-type layer 31 as a second conductivity-type semiconductor layer is disposed over the entire second conductivity-type region (p-type region) 2, and extending over the boundary region 9. In the boundary region 9, the p-type layer 31 and the n-type layer 61 overlaps each other. In the boundary region 9, the insulating layer 41 is disposed on the p-type layer 31, and the n-type layer 61 is disposed thereon for preventing leakage between the p-type layer and the n-type layer.

In other words, the p-type region 2 is a region where the p-type layer 31 is disposed and neither the insulating layer 41 nor the n-type layer 61 is disposed, and the n-type region 1 is a region where the n-type layer 61 is disposed and neither the p-type layer 31 nor the insulating layer 41 is disposed. In the boundary region 9, the p-type layer 31, the insulating layer 41 and the n-type layer 61 are stacked in this order from the silicon substrate 10 side.

The insulating layer 41 in one or more embodiments is disposed over the entire boundary region 9. In other words, a region provided with the insulating layer 41 is defined as a boundary region. A region other than the boundary region, which is provided with the first conductivity-type semiconductor layer (n-type layer), is defined as a first conductivity-type region (n-type region), and a region other than the boundary region, which is provided with the second conductivity-type semiconductor layer (p-type layer) is defined as a second conductivity-type region (p-type region).

When light is incident to the silicon substrate 10 as a photoelectric conversion layer from the light-receiving side, photocarriers (holes and electrons) are generated, and holes and electrons move to the p-type layer and the n-type layer, respectively. In the photoelectric conversion device of one or more embodiments of the present invention, the p-type layer 31 and the n-type layer 61 overlap each other in the boundary region 9, and are gaplessly disposed on the back side of the silicon substrate 10, and therefore photocarriers generated in the silicon substrate 10 can be efficiently collected.

In the n-type region 1 as a first conductivity-type region, in one or more embodiments a first electrode 71 (n-side electrode) is disposed on the n-type layer 61, and in the p-type region 2 as a second conductivity-type region, a second electrode 72 (p-side electrode) is disposed on the p-type layer 31. Electrons moving to the n-type layer 61 are collected in the n-side electrode 71, and holes moving to the p-type layer 31 are collected in the p-side electrode 72. Carriers collected in the electrode are extracted to the outside through a wiring member (not shown) mounted on the electrode.

The n-side electrode 71 on the n-type layer 61 is disposed, in one or more embodiments, over the entire n-type region 1. Therefore, in the photoelectric conversion device 101, the n-type layer 61 and the n-side electrode 71 are arranged over the entire n-type region 1 on the silicon substrate 10. The n-side electrode 71 is disposed extending over the boundary region 9. Therefore, on a side of the boundary region 9, which is in contact with the n-type region 1, the followings are stacked on the silicon substrate 10: the p-type layer 31 as a second conductivity-type semiconductor layer, the insulating layer 41, the n-type layer 61 as a first conductivity-type semiconductor layer and the n-side electrode 71 as a first electrode. In the photoelectric conversion device 101 shown in FIG. 2, on the other hand, the n-side electrode 71 is not disposed at an end portion of the boundary region 9, which is in contact with the p-type region 2, and the p-type layer 31, the insulating layer 41 and the n-type layer 61 are stacked on the silicon substrate 10.

In one or more embodiments, the p-side electrode 72 on the p-type layer 31 is disposed over the entire p-type region 2 or on a part of the p-type region 2. In the photoelectric conversion device 101 shown in FIG. 2, the p-side electrode 72 is not disposed in a portion of the p-type region 2, which is in contact with the boundary region 9. Thus, the p-type region 2 has two portions where the p-type layer 31 and the p-side electrode 72 are disposed on the silicon substrate 10, and where the p-side electrode is not disposed on the p-type layer 31.

In one or more embodiments, the p-side electrode 72 as a second electrode is not in contact with the n-type layer 61 as a first conductivity-type semiconductor layer. The first electrode 71 and the second electrode 72 are separated from each other by a separation groove 79, which is formed over a p-type region 2—side end portion 69 of the n-type layer 61 disposed over the boundary region 9. When the positions of the lateral surface of the insulating layer 41 and the lateral surface of the n-type layer 61 are matched with each other, the separation groove 79 is formed over a portion where the boundary region 9 and the p-type region 2 are in contact with each other as shown in FIG. 2. In FIG. 2, the separation groove 79 is formed extending over the boundary region 9 and the p-type region 2.

In one or more embodiments, the separation groove 79 is formed along the extending direction of the boundary region 9. That is, when the first conductivity-type region, the second conductivity-type region, and the boundary region 9 that separates these regions are disposed so as to extend along the second direction (y direction), the separation groove 79 is also formed so as to extend along the second direction.

As in the photoelectric conversion device 101 shown in FIG. 2, in a photoelectric conversion device of one or more embodiments including a single-crystalline silicon substrate, it is preferable that the first intrinsic semiconductor layer 51 is disposed on the n-type layer 61 on the silicon substrate 10 side, and the second intrinsic semiconductor layer 21 is disposed on the p-type layer 31 on the silicon substrate 10 side. The first intrinsic semiconductor layer 51 is patterned like the n-type layer 61, and the second intrinsic semiconductor layer 21 is patterned like the p-type layer 31. Although these intrinsic semiconductor layers do not contribute directly to carrier collection, a passivation effect on the silicon substrate can be obtained when an intrinsic semiconductor layer is disposed on a surface of the silicon substrate 10. In addition, in the photoelectric conversion device 101 shown in FIG. 2, the lateral surface of the p-type layer 31 is covered with the i-layer 51 to contribute to prevention of leakage between the p-type layer 31 and the n-type layer 61. In one or more embodiments, each of the intrinsic semiconductor layers 21 and 51 is preferably an intrinsic amorphous silicon thin-film as in the case of the above-mentioned passivation layer 11.

In the photoelectric conversion device 101 shown in FIG. 2, the lateral surfaces of the i-layer 21 and the p-type layer 31 are not covered with the insulating layer 41, and the insulating layer 41 is not in contact with the silicon substrate 10. The lateral surfaces of the i-layer 21 and the p-type layer 31 are covered with the first intrinsic semiconductor layer 51 that is disposed under the n-type layer 61. In this configuration, the i-layer 21 or the i-layer 51 is disposed in contact with the silicon substrate 10 throughout the n-type region 1, the p-type region 2 and the boundary region 9. Accordingly, the passivation effect on the silicon substrate is enhanced due to the intrinsic semiconductor layer gaplessly disposed on the back surface of the silicon substrate 10, so that the conversion efficiency of the photoelectric conversion device of one or more embodiments can be improved.

Figure 3:
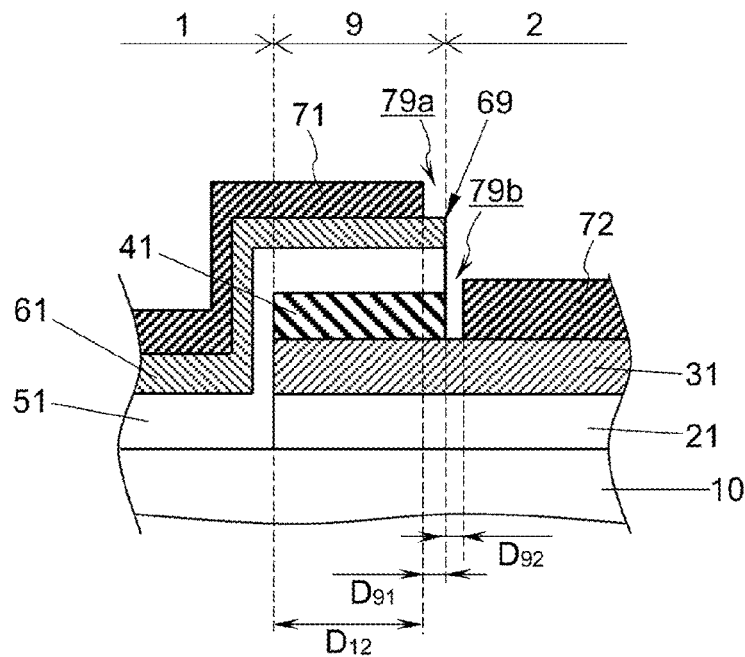
FIG. 3 is a schematic sectional view of the vicinity of a boundary region of a photoelectric conversion device of one embodiment.

FIG. 3 is an enlarged view of the vicinity of the boundary region of the photoelectric conversion device in FIG. 2. In FIG. 2, the height of the upper surface of a single layer is equalized by enlarging the thickness of the intrinsic semiconductor layer 51 in the n-type region 1, for the purpose of simplification of illustration, but when each layer is formed by a dry process such as sputtering or CVD, the intrinsic semiconductor layer has substantially the same thickness on the boundary region 9 and on the n-type region 1. Thus, as shown in FIG. 3, a level difference is formed in a portion where the n-type region 1 and the boundary region 9 are in contact with each other.

The insulating layer 41 is covered with the n-type layer 61 with the i-layer 51 interposed therebetween at the level difference portion on the lateral surface on the n-type region 1—side. In the configuration shown in FIG. 3, the lateral surface of the insulating layer 41 on the n-type region 1—side is covered with the i-layer 51, the n-type layer 61 and the n-side electrode 71. On the other hand, the lateral surface of the insulating layer 41 on the p-type region 2 side is not covered with any of the p-type layer 31 and the n-type layer 61. When separation grooves 79a and 79b separating the first electrode 71 and the second electrode 72 from each other are formed extending over the boundary region 9 and the p-type region 2, the insulating layer 41 is separated from the second electrode 72 as shown in FIG. 3. Accordingly, the lateral surface of the insulating layer 41 on the p-type region 2 side is not in contact with any semiconductor layer and electrode, since the separation groove 79b is formed in contact with the insulating layer 41 on the p-type region 2 side.

In the photoelectric conversion device of one or more embodiments of the present invention, the p-type layer 31 on the p-type region 2 is formed extending over the boundary region 9, and disposed between the silicon substrate 10 and the insulating layer 41. The n-type layer 61 on the n-type region 1 is formed extending over the boundary region 9, and disposed on the insulating layer 41 to cover the lateral surface of the insulating layer 41. In addition to the n-type layer 61, the n-side electrode 71 is formed extending over the boundary region 9, so that the electrode area is increased, carrier collection efficiency is improved, and the fill factor of the photoelectric conversion device of one or more embodiments can be improved. Further, since the n-type layer 61 is covered with the n-side electrode 71 not only on the n-type region but also on the boundary region 9, the n-side electrode acts as a barrier layer for the n-type layer, so that carrier lifetime reduction is suppressed to improve open circuit voltage of the photoelectric conversion device of one or more embodiments. In addition, since the electrode formed on the semiconductor layer also acts as a barrier layer that prevents ingress of metal elements contained in water vapor in the environment, a wiring member and so on, reliability after modularization is improved.

Figure 11:
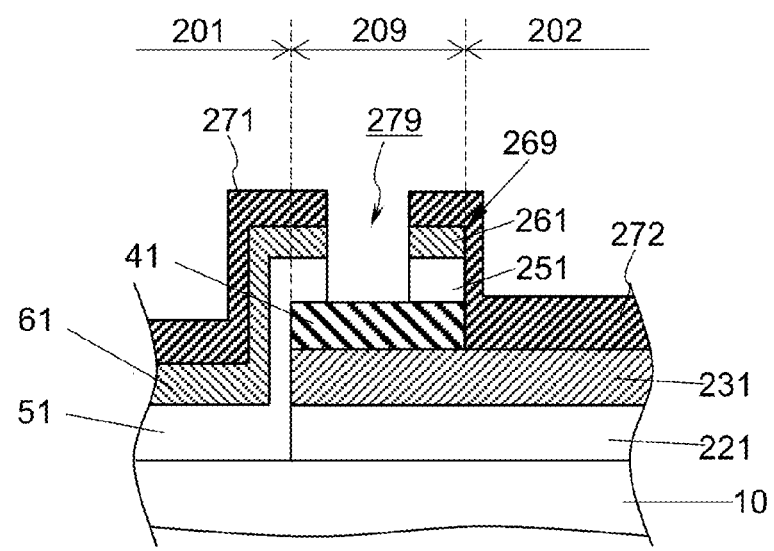
FIG. 11 is a schematic sectional view of the vicinity of a boundary region of a photoelectric conversion device of comparative example.

In a comparative example shown in FIG. 11, a separation groove 279 is located near the center of a boundary region 209. In this configuration, an n-side electrode 271 is disposed in the boundary region 209 on the n-type region 201, and a p-side electrode 272 is disposed on the p-type region 202 side. The p-side electrode 272—formed region on the boundary region 209, where the p-side electrode 272 is disposed on the n-type layer 261, is a region which does not contribute to carrier collection. When the area of the region that does not contribute to carrier collection increases, the conversion efficiency of the photoelectric conversion device of one or more embodiments is deteriorated.

On the other hand, in the photoelectric conversion device of one or more embodiments of the present invention, the separation groove 79 is located on a portion including the end portion 69 of the n-type layer 61 on the boundary region 9, so that the n-side electrode 71 and the p-side electrode 72 are separated from each other. The n-side electrode 71 is disposed on the n-type layer 61, and is not in contact with the p-type layer 31. The p-side electrode 72 is disposed on the p-type layer 31, and is not in contact with the n-type layer 61. Therefore, leakage can be effectively reduced, the electrode-formed region is not wasted, carrier collection efficiency is improved, the area of an exposed portion of the semiconductor layer is small, and protection of the semiconductor layer by the electrode is improved.

In the configuration shown in FIG. 11, it is necessary to separate the n-type layers 61 and 261 as well as the electrodes 271 and 272 by the separation grooves 279 for preventing leakage. Since it is necessary to separate the n-type layer after separation of the electrode, the manufacturing process is complicated. In formation of a photoelectric conversion device according to one or more embodiments of the present invention, in contrast, the p-type region and the n-type region can be electrically separated from each other only by forming the separation groove 79 so as to remove the end portion 69 of the n-type layer 61 and the electrode layer in the vicinity thereof, and it is not necessary to separate the semiconductor layer after separation of the electrode. Thus, the photoelectric conversion device of one or more embodiments of the present invention allows to simplify the patterning process, and thus is excellent in productivity.

In the embodiment shown in FIG. 11, it is necessary to increase the width of the separation groove 279 for reliably separating n-type layers 61 and 261, and it is accordingly necessary to increase the width of the boundary region 9. Since photocarriers generated immediately below the boundary region move over a long distance before being extracted by the electrode through the semiconductor layer, the boundary region 9 has lower photoproduction carrier collection efficiency as compared to the p-type region and the n-type region. Thus, for obtaining a back-contact photoelectric conversion device excellent in conversion characteristics, it is preferable that, in one or more embodiments, leakage can be reliably prevented, and the boundary region has a small width.

In the photoelectric conversion device of one or more embodiments of the present invention, the p-type region and the n-type region can be electrically separated from each other merely by forming the separation groove 79 on a portion including the end portion 69 of the n-type layer 61 on the p-type region 2—side, and leakage can be reliably prevented even when the width of the boundary region 9 (width of the insulating layer 41) is small. Thus, the photoelectric conversion device of one or more embodiments of the present invention is excellent in productivity. In addition, the width of the boundary region can be reduced, and accordingly, conversion characteristics can be improved.

When the first conductivity-type region 1 and the second conductivity-type region 2 are alternately arranged along one direction (x direction) on the surface of the photoelectric conversion device of one or more embodiments as shown in FIGS. 1 and 2, it is preferable that the width $D_{10}$ of the first electrode 71, the width $D_{11}$ of the first conductivity-type region 1 and the width $D_{20}$ of the second electrode 72 in the x direction satisfy the relationship of $D_{11} \leq D_{20} \leq D_{10}$.

In the configuration shown in FIG. 2, the second electrode 72 is formed only in the second conductivity-type region 2, and therefore the second electrode 72 can effectively collect carriers throughout the width $D_{20}$. In addition, a portion of the first electrode 71, which is formed in the first conductivity-type region 1 having the width $D_{11}$, can effectively collect carriers similarly to the second electrode 72. On the other hand, the first electrode on the boundary region 9 plays a role of supplementary collecting carriers that have not been collected in the electrode on the first conductivity-type region. Thus, by satisfying the relationship of $D_{11} \leq D_{20} \leq D_{10}$, the amount of holes collected in the p-side electrode can be balanced with the amount of electrons collected in the n-side electrode to reduce resistance.

In one or more embodiments, the width $D_{11}$ of the first electrode disposed overlapping with the first conductivity-type region 1, in the total width $D_{10}$ of the first electrode 71, may be preferably 1.5 to 15 times, more preferably 3 to 12 times the width $(D_{12a}+D_{12b})$ of the first electrode disposed overlapping with the boundary region 9. When the ratio of the width $D_{11}$ to the width $(D_{12a}+D_{12b})$ is within the above-mentioned range, the amount of carriers collected by the first electrode disposed overlapping on the boundary region can be set within an effective range.

Preferably, in one or more embodiments, the width of the boundary region 9 is as small as possible within a range which ensures that the first electrode and the second electrode can be reliably separated from each other by the separation groove 79. The width of the boundary region 9 may be preferably 300 μm or less, more preferably 200 μm or less, and further preferably 100 μm or less. The lower limit of the width of the boundary region is not particularly limited, and may be set with consideration given to patterning accuracy. From the viewpoint of reliably separating the first electrode and the second electrode from each other by the separation groove 79, the width of the boundary region 9 may be preferably 30 μm or more, more preferably 50 μm or more.

In one or more embodiments, it is preferable that in the boundary region 9, a width $D_{12}$ of a first electrode-formed region and a width $D_{91}$ of a first electrode-non-formed region satisfy the relationship of $D_{91} \leq D_{12}$ (see FIG. 3). By reducing the width $D_{10}$ of the electrode-non-formed region, the area of the electrode is increased to enhance carrier collection efficiency, and the area of an exposed portion of the first conductivity-type semiconductor layer is reduced, so that the durability of the photoelectric conversion device of one or more embodiments can be improved. The first electrode-non-formed region in the boundary region 9 is identical to a separation groove 79a-formed portion in the boundary region 9.

The second conductivity-type semiconductor layer 31 of one or more embodiments is exposed immediately below the separation groove 79b on the second conductivity-type region 2. As described above, carriers can be effectively collected throughout the second conductivity-type region in the width direction. Therefore, in one or more embodiments, the area of an exposed portion of the second conductivity-type semiconductor layer 31 in the second conductivity-type region 2 is preferably made as small as possible, so that substantially the entire surface of the second conductivity-type semiconductor layer 31 is covered with the second electrode 72. In addition, when substantially the entire surface of the second conductivity-type semiconductor layer 31 is covered with the second electrode 72, carrier lifetime reduction can be considerably suppressed. A width $D_{92}$ of the separation groove 79b formed overlapping with the second conductivity-type region 2 may be preferably 50 μm or less, more preferably 20 μm or less, further preferably 10

µm or less. The width $D_{92}$ of the separation groove 79b formed overlapping with the second conductivity-type region 2 is ideally 0. For reliably separating the first electrode and the second electrode from each other, the width $D_{92}$ may be preferably 1 µm or more, more preferably 3 µm or more.

When the separation groove 79 of one or more embodiments is formed across the boundary region 9 and the second conduction type region 2, the width $D_{92}$ of the separation groove 79b overlapping with the second conductivity-type region 2 may be preferably smaller than a width $D_{91}$ of the separation groove 79a overlapping with the boundary region 9. The second conductivity-type semiconductor layer 31 is exposed immediately below the separation groove 79b of the second conductivity-type region 2, and the first conductivity-type semiconductor layer 61 is exposed immediately below the separation groove 79a of the boundary region 9. As described above, the second conductivity-type region 2 is a region where carriers can be effectively collected throughout the region in the width direction, and therefore the width $D_{92}$ of the separation groove 79b on the second conductivity-type region 2 may be preferably as small as possible. On the other hand, the separation groove 79a-formed portion on the boundary region 9 is situated at a position that is most distant from the first conductivity-type region 1, and therefore the amount of carriers reaching the first conductivity-type semiconductor layer 61 immediately below the separation groove 79a is smaller than the amount of carriers reaching the second conductivity-type semiconductor layer 31 immediately below the separation groove 79b of the second conductivity-type region 2. Thus, the conversion characteristics of the photoelectric conversion device of one or more embodiments can be improved, when the center of the separation groove 79 in the width direction is set on the boundary region 9 side, and the width $D_{92}$ is made equal to or less than the width $D_{91}$, while a width of the separation groove 79 for reliably separating the first electrode 71 and the second electrode 72 from each other is secured.

By selecting a method, of one or more embodiments, for formation of the semiconductor layer and the electrode layer and a method for patterning of the semiconductor layer and the electrode layer in the process for formation of the photoelectric conversion device of one or more embodiments, the widths of the first conductivity-type region, the second conductivity-type region and the boundary region, the width of the electrode, and the width of the separation groove can be adjusted. Hereinafter, a method for manufacturing the photoelectric conversion device 101 will be described with reference to FIGS. 4A to 4G.

First, the semiconductor substrate 10 is provided. In one or more embodiments, when a single-crystalline silicon substrate is used as the semiconductor substrate, the thickness of the silicon substrate is preferably about 100 to 300 µm. The single-crystalline silicon substrate may be either a p-type substrate or an n-type substrate. When an n-type single-crystalline silicon substrate is used, conversion efficiency tends to be higher. The shape of the silicon substrate 10 is generally a substantially square shape (semi-square shape) as shown in FIG. 1, but is not limited thereto.

For increasing the amount of light captured in the substrate, it is preferable that, in one or more embodiments, a textured structure (not shown) having an unevenness height of about 0.5 to 10 µm is formed on the light-receiving surface of the silicon substrate. A textured structure may also be formed on the back side of the silicon substrate. The textured structure is formed by, for example, anisotropic etching of crystalline silicon.

Figure 4A:
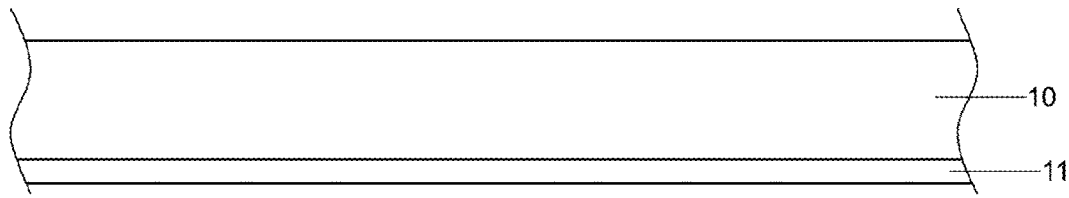
FIG. 4A is a schematic sectional view for illustrating a method for manufacturing a photoelectric conversion device.

As shown in FIG. 4A, the passivation layer 11 is formed on the light-receiving side of the silicon substrate 10 as necessary. Further a conductivity-type semiconductor layer, an anti-reflection layer (not shown) and the like may be disposed on the passivation layer 11. Preferably, in one or more embodiments, these thin-films are formed by a dry process such as CVD or sputtering. Formation of each layer on the light-receiving-side of the silicon substrate 10 may be performed either before or after formation of the semiconductor layer or the electrode layer on the back side, or the passivation layer or the like may be formed on the light-receiving side during formation of the semiconductor layer and the electrode layer on the back side.

When an i-type amorphous silicon layer is formed as the passivation layer 11, a silicon-containing gas such as $SiH_4$ or $Si_2H_6$, or a mixed gas obtained by diluting a silicon-containing gas with hydrogen is introduced into the chamber as a raw material gas, and deposition by plasma-enhanced CVD is performed. For example, a substrate temperature of 100 to 300° C., a pressure of 20 to 2600 Pa and a high-frequency power density of 0.004 to 0.8 W/cm² are employed for CVD conditions. The thickness of the passivation layer 11 of one or more embodiments is preferably about 1 to 20 nm.

In one or more embodiments including a conductivity-type silicon-based thin-film, $B_2H_6$, $PH_3$, or the like may be used as a dopant gas in addition to the above-mentioned raw material gas. By using a gas containing a heterogeneous element such as $CH_4$, $CO_2$, $NH_3$ or $GeH_4$, in addition to the above-mentioned gas, a silicon alloy such as silicon carbide, silicon oxide, silicon nitride or silicon germanium can be formed. In one or more embodiments, the thickness of the conductivity-type silicon-based thin-film is preferably about 3 to 50 nm.

In one or more embodiments, as the anti-reflection layer, an insulating material having high light-transmittance is preferably used. For example, silicon dioxide ($SiO_2$), silicon nitride ($Si_3N_4$), silicon oxynitride (SiON), sialon (SiAlON), aluminum oxide ($Al_2O_3$) and the like may be preferable. The thickness of the anti-reflection layer may be preferably set within a range of about 50 nm to 1 µm with consideration given to anti-reflection characteristics, a light transmittance and the like. The anti-reflection layer can be formed by a CVD method, a PVD method such as sputtering, or a wet process.

Hereinafter, a process for forming each layer on the back side will be described with an example in which an n-type layer is formed as the first conductivity-type semiconductor layer and a p-type layer is formed as the second conductivity-type semiconductor layer.

Preferably, in one or more embodiments, an amorphous silicon thin-film is formed as each of i-layers 21 and 51 on the back side. Preferably, in one or more embodiments, a thin-film of amorphous silicon, an amorphous silicon alloy, microcrystalline silicon, a microcrystalline silicon alloy or the like is formed as each of the p-type layer 31 and the n-type layer 61. Examples of the silicon alloy include silicon carbide, silicon oxide, silicon nitride and silicon germanium as described above. Preferably, in one or more embodiments, such a silicon-based thin-film is formed by a plasma-enhanced CVD method. The film thickness of the i-layer may be preferably about 1 to 20 nm. The film thickness of each of the p-type layer and the n-type layer may be preferably about 2 to 50 nm.

In one or more embodiments, as the insulating layer 41, it is preferable to use an insulating material as in the case of the anti-reflection layer. The insulating layer 41 disposed on the back side is not required to be light-transmissive, and a light reflecting material or a light absorbing material may be used. The thickness of the insulating layer 41 may be preferably about 2 nm to 1 μm. The insulating layer can be formed by a CVD method, a PVD method such as a sputtering method, or a wet process.

In one or more embodiments, the electrode formed on the conductivity-type silicon thin-film is preferably a transparent electroconductive layer composed of a transparent conductive oxide (TCO). In one or more embodiments, the TCO is preferably indium oxide ($In_2O_3$), zinc oxide (ZnO), tin oxide ($SnO_2$), titanium oxide ($TiO_2$), or a composite oxide thereof. The TCO may be doped with a dopant such as Sn, Zn, W, Sb, Ti, Al, Ga or Ce. Among these oxides, indium tin oxide (ITO) may be especially preferable. The thickness of the transparent electroconductive layer may be preferably about 10 nm to 100 nm. The transparent electroconductive layer can be formed by a sputtering method, an MOCVD method or the like.

In one or more embodiments, a metal layer of Cu, Ag, Al, Sn or the like may be formed on the transparent electroconductive layer. The metal layer can be formed by a PVD method such as a sputtering method, a plating method, a printing method, or the like. When a metal layer is disposed on the transparent electroconductive layer, the thickness thereof may be preferably about 50 nm to 10 μm.

Hereinafter, a process for forming the i-p-type layer 3, the insulating layer 41, the i-n-type layer 5 and electrodes 71 and 72 on the back surface of the silicon substrate 10 will be described with reference to FIGS. 4B to 4G.

Figure 4B:
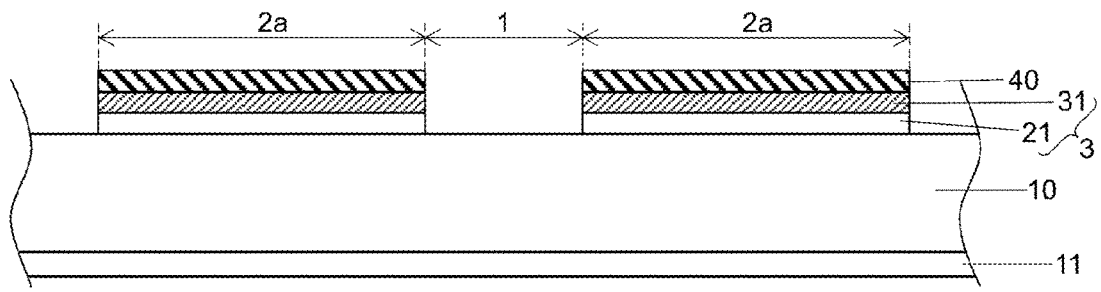
FIG. 4B is a schematic sectional view for illustrating a method for manufacturing a photoelectric conversion device.

First, as shown in FIG. 4B, the i-layer 21 and the p-type layer 31 are formed in a region corresponding to the second conductivity-type region 2 and the boundary region 9 on the silicon substrate 10. Further, the insulating layer 40 is formed on the p-type layer 31. The i-p-type layer 3 and the insulating layer 40, which are patterned, are formed in the region (region 2a) corresponding to the second conductivity-type region and the boundary region. The i-p-type layer 3 and the insulating layer 40 are not disposed in a region corresponding to the first conductivity-type region 1.

Examples of the method of one or more embodiments for forming the patterned i-p-type layer and insulating layer include a method in which a region corresponding to the first conductivity-type region 1 is shielded with a mask, so that an i-p-type layer and an insulating layer are disposed only over the region 2a; and a method in which layers disposed over the entire surface of the silicon substrate 10 are patterned by etching.

When the i-p-type layer and the insulating layer of one or more embodiments are patterned by etching, the insulating layer of the first conductivity-type region 1 is removed by etching at first. For example, a resist film having an opening in the first conductivity-type region 1 is formed, and wet etching is performed with the resist film as a mask, whereby the insulating layer is patterned. When the material of the insulating layer is a silicon-based material such as silicon dioxide, silicon nitride or silicon oxynitride, hydrofluoric acid (HF) may be used as an etchant.

When using the patterned insulating layer 40 as a mask, the i-p-type layer exposed to an opening section of the insulating layer 40 is etched after the insulating layer is etched, patterning can be performed in such a manner that the end surfaces of the insulating layer 40 and the i-p-type layer 3 are matched with each other. For etching the p-type layer and the i-layer, use of an acidic aqueous solution containing hydrofluoric acid (HF) may be preferable, and in particular, a mixed acid of hydrofluoric acid and nitric acid may be preferably used.

Figure 4C:
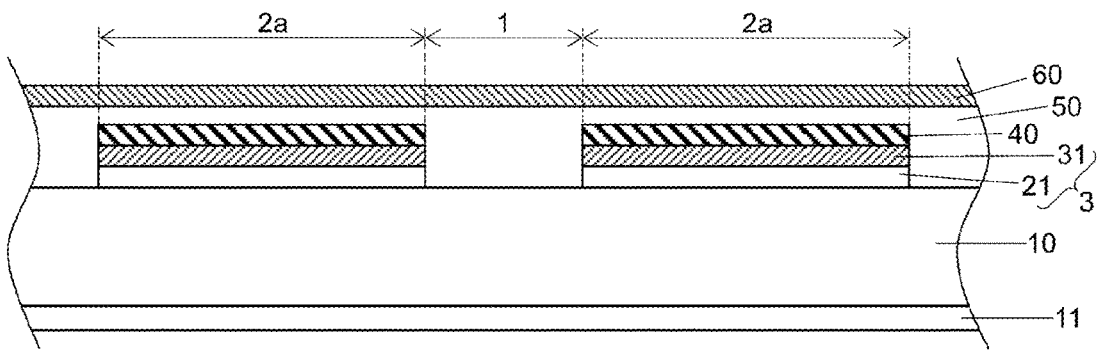
FIG. 4C is a schematic sectional view for illustrating a method for manufacturing a photoelectric conversion device.
Figure 4D:
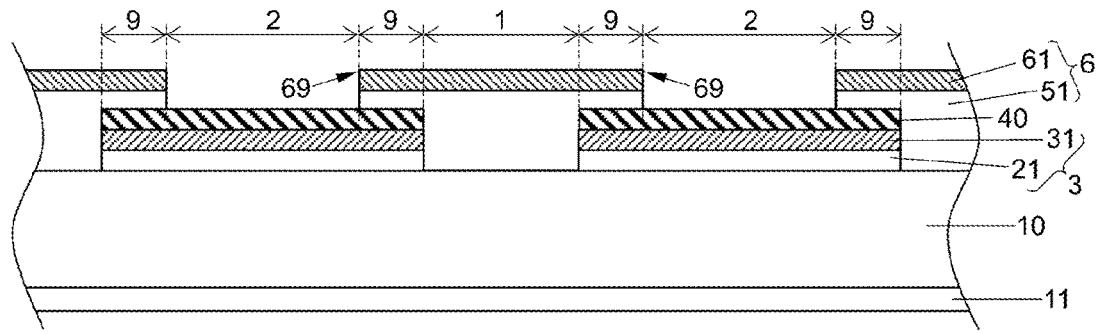
FIG. 4D is a schematic sectional view for illustrating a method for manufacturing a photoelectric conversion device.

Next, as shown in FIG. 4D, the i-layer 51 and the n-type layer 61 are disposed over the region corresponding to the first conductivity-type region 1 and the boundary region 9. The i-n-type layer 6 is disposed on the silicon substrate 10 over the first conductivity-type region 1, and is disposed on the insulating layer 41 over the boundary region 9. Examples of the method for forming a patterned i-n-type layer include a method in which a region corresponding to the second conductivity-type region 2 is shielded with a mask; and a method in which an i-n-type layer is formed over the entire surface, and then patterned by etching or the like as shown in FIG. 4C. An alkaline aqueous solution such as NaOH solution may be preferably used for etching the i-n-type layer.

Figure 4E:
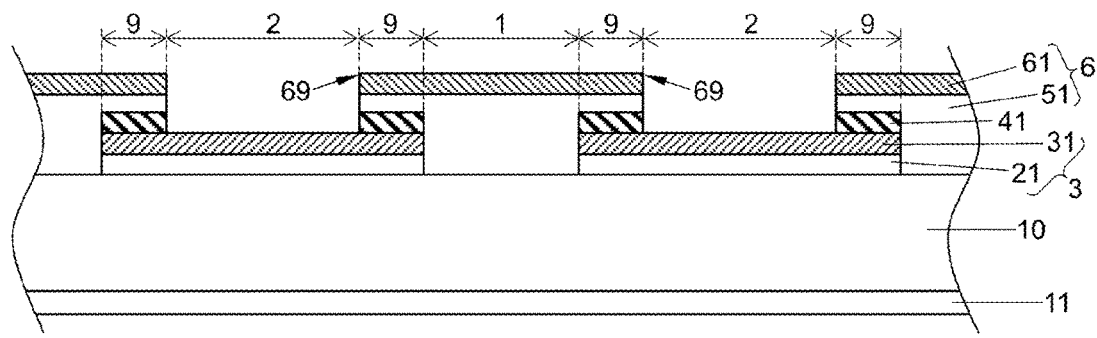
FIG. 4E is a schematic sectional view for illustrating a method for manufacturing a photoelectric conversion device.

Thereafter, using the i-n-type layer 6 as a mask, the insulating layer 40 exposed to the second conductivity-type region 2 as an opening section of the i-n-type layer 6 is etched away with HF or the like to perform patterning. As shown in FIG. 4E, in the second conductivity-type region 2 from which the insulating layer 40 is removed, the i-p-type layer 3 is exposed.

Figure 4F:
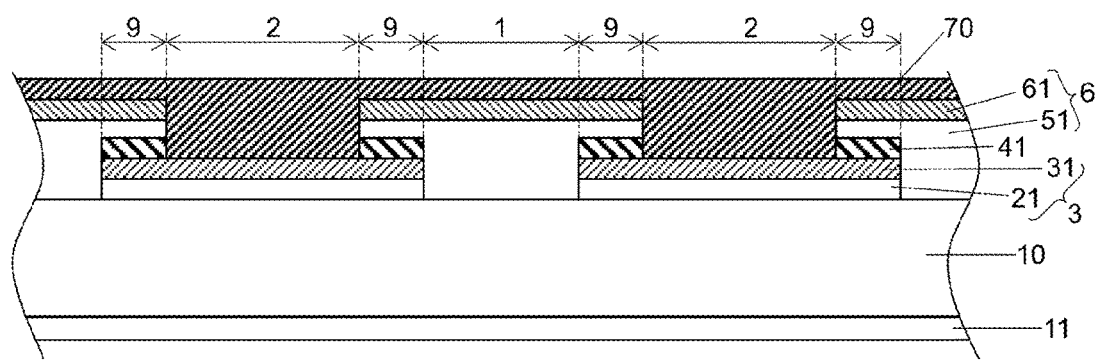
FIG. 4F is a schematic sectional view for illustrating a method for manufacturing a photoelectric conversion device.

Next, as shown in FIG. 4F, the electrode layer 70 is formed on the p-type layer 31 of the second conductivity-type region and on the n-type layer 61 of the first conductivity-type region 1 and the boundary region 9.

Figure 4G:
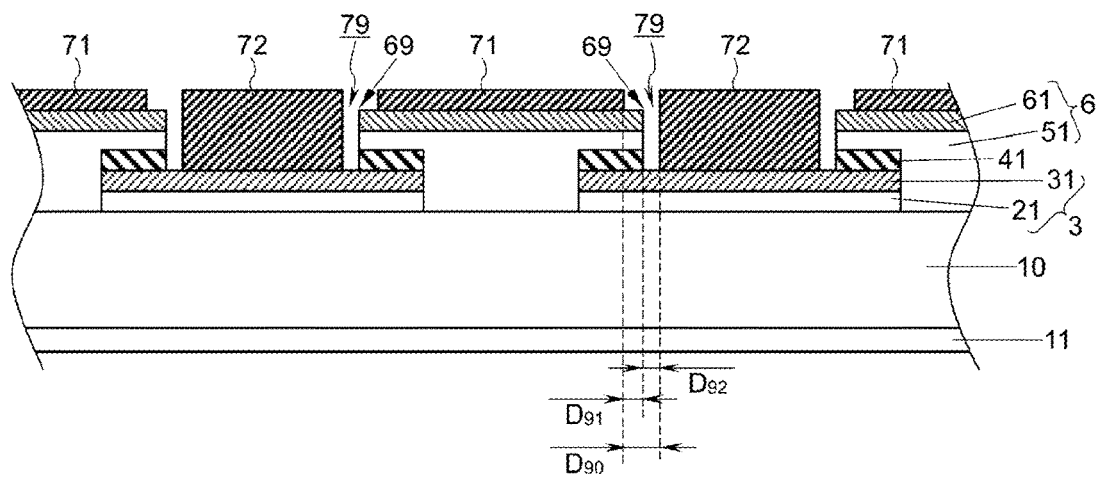
FIG. 4G is a schematic sectional view for illustrating a method for manufacturing a photoelectric conversion device.

Thereafter, the electrode layer 70 disposed on the end portion 69 of the first conductivity-type semiconductor layer 61 is removed to form the separation groove 79. The width $D_{90}$ of the separation groove 79 may be preferably about 5 to 50 μm. As shown in FIG. 4G, the separation groove 79—formed portion includes the lateral surface of the first conductivity-type semiconductor layer 61. In the separation groove 79—formed portion, the lateral surface of the first conductivity-type semiconductor layer 61 is not covered with the electrode, and thus is exposed. The separation groove 79 separates the electrode layer into the first electrode 71 and the second electrode 72, wherein the first electrode 71 is disposed over the entire first conductivity-type region 1 and extending over the boundary region 9, and the second electrode 72 is disposed over the second conductivity-type region 2. For etching the transparent electroconductive layer, an etchant containing hydrochloric acid and ferric chloride may be used.

Figure 6:
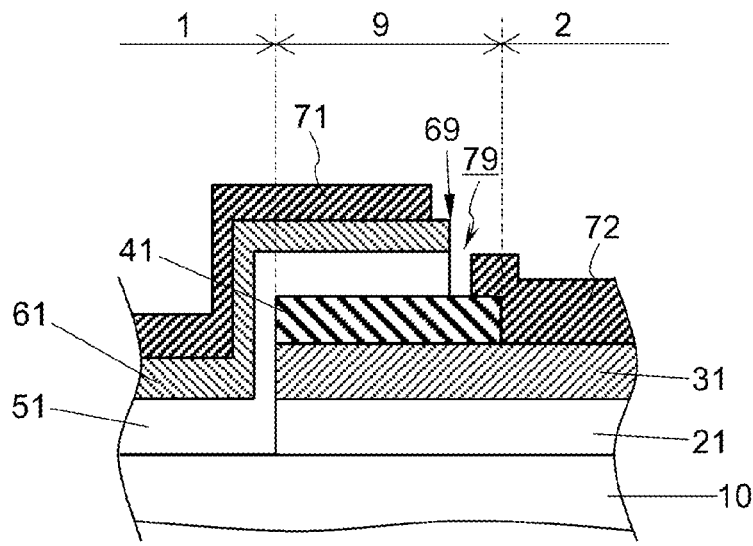
FIG. 6 is a schematic sectional view of the vicinity of a boundary region of a photoelectric conversion device of one embodiment.
Figure 7:
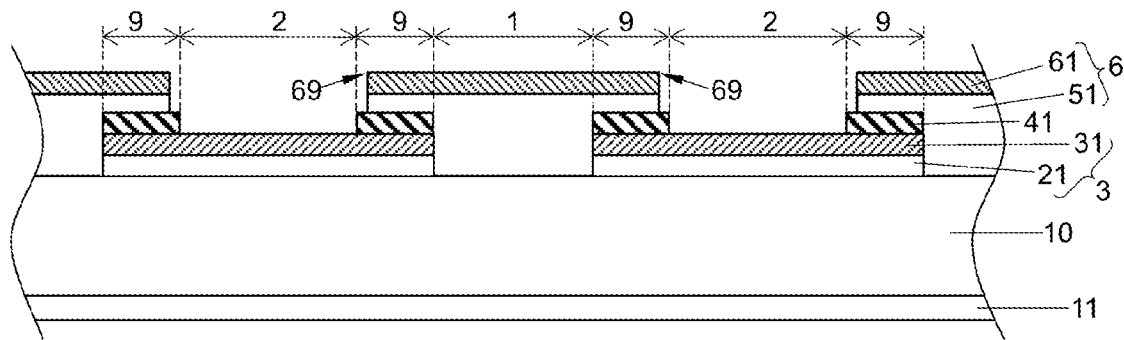
FIG. 7 is a schematic sectional view for illustrating a method for manufacturing a photoelectric conversion device.
Figure 10:
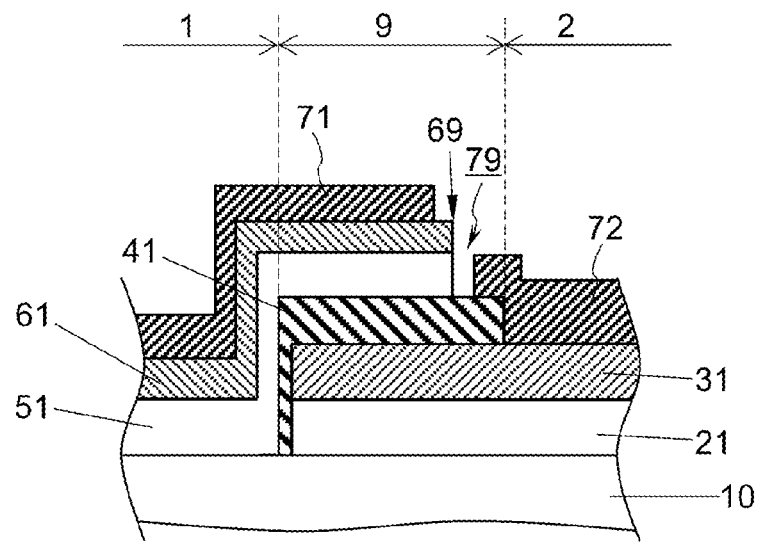
FIG. 10 is a schematic sectional view of the vicinity of a boundary region of a photoelectric conversion device of one embodiment.

As long as the region on which the separation groove 79 is formed overlaps the end portion 69 of the first conductivity-type semiconductor layer 61, the separation groove 79—formed region of one or more embodiments may include only the boundary region 9, or include the second conductivity-type region 2 as well as the boundary region 9. In one or more embodiments, it is preferable that the separation groove 79 is formed across both the boundary region 9 and the second conductivity-type region 2, from the viewpoint of reliably separating the first electrode 71 and the second electrode 72 from each other, and preventing leakage between the p-type layer 31 and the n-side electrode 71 and leakage between the n-type layer 61 and the p-side electrode 72. In one or more embodiments, it is preferable that the separation groove 79 is formed across both the boundary region 9 and the second conductivity-type region 2, when the position of the lateral surface of the insulating layer 41 and the position of the lateral surface of the n-type layer 61 are matched with each other. On the other hand, the separation groove 79 may be formed only in the insulating region 9, and is not required to be formed in the second conductivity-type region, when the lateral surface of the n-type layer 61 is situated inside the lateral surface of the insulating layer 41 in the boundary region 9 as shown in FIGS. 6, 7 and 10.

As described above, in one or more embodiments, the width $D_{92}$ of the separation groove 79b overlapping with the second conductivity-type region 2 is preferably as small as possible, and preferably smaller than the width $D_{91}$ of the separation groove 79a overlapping with the boundary region 9. When in etching of the electrode layer, the center of the etching region in the width direction is set on the boundary region 9 side from a portion where the boundary region 9 and the second conductivity-type region 2 are in contact with each other, the width $D_{92}$ of the separation groove 79b overlapping with the second conductivity-type region 2 can be reduced while the width $D_{90}$ of the separation groove for reliably separating the first electrode and the second electrode from each other is secured.

When the separation groove 79 is formed on a portion including the end portion 69 of the first conductivity-type semiconductor layer 61 as described above, in addition to that the first electrode and the second electrode can be separated from each other, leakage between the p-type layer 31 and the n-side electrode 71 and leakage between the n-type layer 61 and the p-side electrode 72 can be eliminated. Thus, in the method according to one or more embodiments of the present invention, it is not necessary to further etch the p-type layer and the n-type layer after the electrode layer is etched, and thus the process for production of the photoelectric conversion device of one or more embodiments can be simplified.

Since etching may be performed on a portion including the end portion of the first conductivity-type semiconductor layer, it is easy to adjust the etching position even when the width of the boundary region 9 is small. Therefore, as compared to a configuration in which the separation groove 279 is formed at the center of the boundary region 209 as in a comparative example shown in FIG. 11, wider process margin is attained, resulting in excellent productivity and thus leading to facilitate yield improvement.

The photoelectric conversion device one or more embodiments formed in this manner is modularized by disposing metal electrodes such as finger electrodes and bus bar electrodes on electrodes 71 and 72 followed by electrical connection of a plurality of cells through a wiring member or the like. The metal electrode may be formed over the entire surface of each of electrodes 71 and 72, or formed on a part thereof. The method for forming the metal electrode is not particularly limited, and a known method such as a printing method or a plating method may be employed.

In the above description, mainly discussed is an embodiment where the first conductivity-type semiconductor layer and the second conductivity-type semiconductor layer are an n-type layer and a p-type layer, respectively. However, in the photoelectric conversion device of one or more embodiments of the present invention, the first conductivity-type semiconductor layer and the second conductivity-type semiconductor layer may be a p-type layer and an n-type layers, respectively.

In the configuration shown in FIGS. 2 and 3, the end portion of the second conductivity-type semiconductor layer 31 is present at the boundary between the first conductivity-type region 1 and the boundary region 9, and the end portion of the first conductivity-type semiconductor layer 61 is present between the second conductivity-type region 2 and the boundary region 9. That is, one lateral surface of the insulating layer 41 is matched with the lateral surface of the p-type layer, and the other lateral surface of the insulating layer 41 is matched with the lateral surface of the n-type layer. In this configuration, the conductivity-type semiconductor layer can be etched with the patterned insulating layer as a mask, and the insulating layer can be etched with the patterned conductivity-type semiconductor layer as a mask. Therefore, there is an advantage that each layer can be easy patterned by etching.

Figure 5:
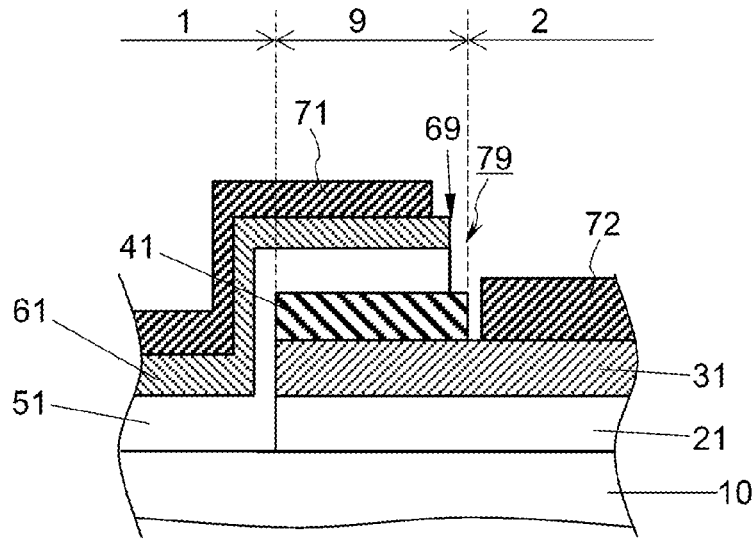
FIG. 5 is a schematic sectional view of the vicinity of a boundary region of a photoelectric conversion device of one embodiment.

In the photoelectric conversion device of one or more embodiments of the present invention, the end surface of the insulating layer and the end surface of the conductivity-type semiconductor layer are not necessarily required to coincide with each other. For example, as shown in FIG. 5, the second conductivity-type region 2—side end portion 69 of the first conductivity-type semiconductor layer 61 on the insulating layer 41 may be situated inside the lateral surface of the insulating layer 41. In this case, the first electrode 71 and the second electrode 72 can be separated from each other by forming the separation groove 79 on a portion including the end portion 69 of the first conductivity-type semiconductor layer.

When the insulating layer 41 protrudes outside the end portion 69 of the first conductivity-type semiconductor layer 61 as shown in FIG. 5, the width of the separation groove 79 on the second conductivity-type region 2 can be further reduced. Thus, the area on which the second conductivity-type semiconductor layer 31 is exposed is reduced, so that improvement of the carrier lifetime can be expected. In addition, when the insulating layer 41 is formed outside the end portion 69 of the first conductivity-type semiconductor layer 61, the insulating layer 41 and the second electrode 72 may be in contact with each other without forming the separation groove 79 in the second conductivity-type region 2.

For example, even when the second electrode 72 is formed overlapping the end portion of the insulating layer 41 in the boundary region 9 as shown in FIG. 6, leakage can be prevented as long as the separation groove 79 is formed so as to remove the electrode on the end portion 69 of the first conductivity-type semiconductor layer 61. This is because the first electrode 71 and the second electrode 72 are separated from each other, and the first conductivity-type semiconductor layer 61 and the second electrode 72 are separated from each other. In this configuration, it is possible to further improve the carrier lifetime because the entire second conductivity-type semiconductor layer 31 is covered with the second electrode 72, and the second conductivity-type semiconductor layer is not exposed. In addition, since the second electrode is formed on the entire second conductivity-type region, carrier collection efficiency can be also improved.

As a method for forming the insulating layer 41 that protrudes outside the end portion 69 of the first conductivity-type semiconductor layer 61, the etching width of the insulating layer 40 may be made smaller than the width of a region, which is not provided with the first conductivity-type semiconductor layer 61, in etching of the insulating layer 40 exposed under the first conductivity-type semiconductor layer 61 (see FIG. 4D). Accordingly, as shown in FIG. 7, the insulating layer 41 can also be left in a region protruding from the end portion 69 of the first conductivity-type semiconductor layer 61.

Figure 8:
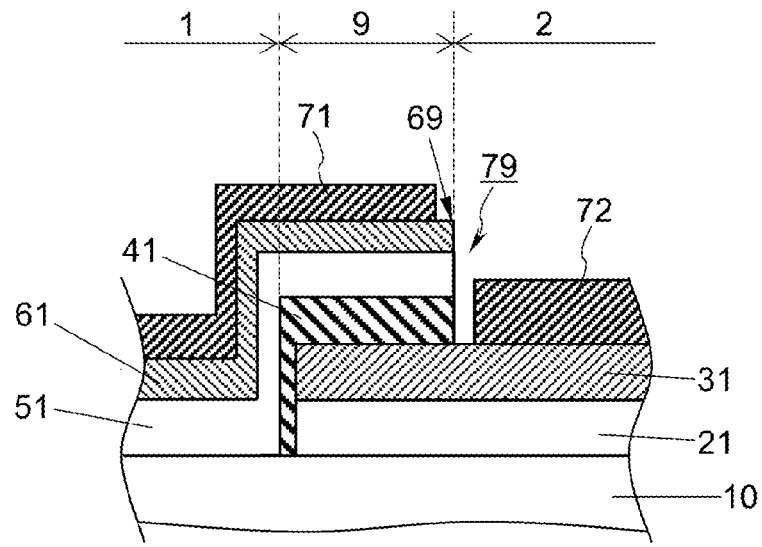
FIG. 8 is a schematic sectional view of the vicinity of a boundary region of a photoelectric conversion device of one embodiment.

As shown in FIG. 8, the lateral surface of the second conductivity-type semiconductor layer 31 may be covered with the insulating layer 41. In the configuration shown in FIGS. 2 and 3, the lateral surface of the second conductivity-type semiconductor layer 31 is covered with the intrinsic semiconductor layer 51, and thus is not in direct contact with the first conductivity-type semiconductor layer 61. Therefore, leakage between the p-type layer and the n-type layer can be suppressed. In contrast, when the lateral surface of the second conductivity-type semiconductor layer 31 is covered with the insulating layer 41 as shown in FIG. 8, leakage between the p-type layer and the n-type layer can be more reliably suppressed.

Figure 9:
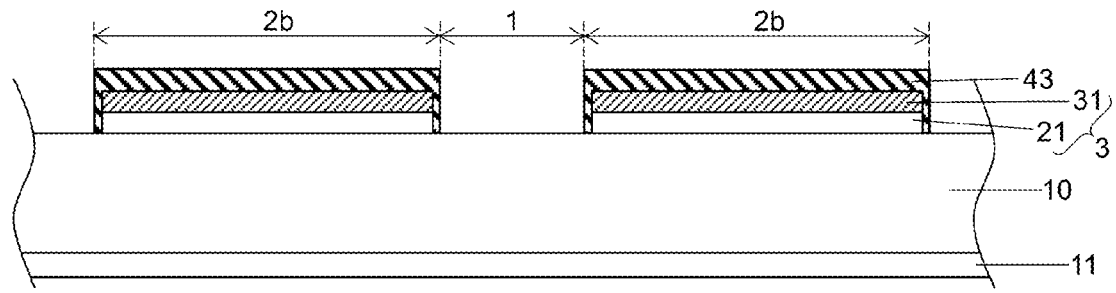
FIG. 9 is a schematic sectional view for illustrating a method for manufacturing a photoelectric conversion device.

The lateral surface of the second conductivity-type semiconductor layer 31 can be covered with the insulating layer by a method in which the second conductivity-type semiconductor layer 31 is patterned in advance and form the insulating layer on the patterned second conductivity-type semiconductor layer 31 as shown in FIG. 9. The lateral surface of the second conductivity-type semiconductor layer 31 can be covered with the insulating layer 43 by, for example, patterning the second conductivity-type semiconductor layer 31 in advance, forming the insulating layer 43 over the entire upper surface, and then etching away the insulating layer on the region 1 in such a manner that the remaining width is larger than the width of the second conductivity-type semiconductor layer 31.

As shown in FIG. 10, the photoelectric conversion device of one or more embodiments of the present invention may have a configuration in which the insulating layer 41 is disposed to protrude outside the end portion 69 of the first conductivity-type semiconductor layer 61, and the lateral surface of the second conductivity-type semiconductor layer 31 is covered with the insulating layer 43.

As described above, the separation groove is formed on a portion including the second conductivity-type region 2—side end portion 69 of the first conductivity-type semiconductor layer 61 on the insulating layer 41. Therefore, patterning can be performed in such a manner that the first electrode 71 and the second conductivity-type semiconductor layer 31 are not in contact with each other, and the second electrode 72 and the first conductivity-type semiconductor layer 61 are not in contact with each other, even when the end surface of the insulating layer 41 and the end surface of the conductivity-type semiconductor layer do not coincide with each other. Accordingly, it is possible to obtain a back-contact photoelectric conversion device of one or more embodiments which is free from leakage between a p-type layer and an n-type layer and which has a large electrode area and excellent conversion characteristics.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF REFERENCE CHARACTERS 1 first conductivity-type region
2 second conductivity-type region
9 boundary region
10 semiconductor substrate (single-crystalline silicon substrate)
31 second conductivity-type semiconductor layer (p-type layer)
61 first conductivity-type semiconductor layer (n-type layer)
41 insulating layer
21, 51 intrinsic semiconductor layer (i-type layer)
71 first electrode
72 second electrode
79 separation groove
101 photoelectric conversion device

What is claimed is:

1. A method for manufacturing a photoelectric conversion device, wherein the photoelectric conversion device comprises a semiconductor substrate having a first conductivity-type region, a second conductivity-type region and a boundary region on a first principal surface of a semiconductor substrate, the boundary region being in contact with and separating the first conductivity-type region and the second conductivity-type region, the method comprising:
    stacking a second conductivity-type semiconductor layer over the second conductivity-type region and the boundary region on the first principal surface of the semiconductor substrate;
    stacking an insulating layer over the second conductivity-type semiconductor layer in the boundary region;
    stacking a first conductivity-type semiconductor layer over the first conductivity-type region on the first principal surface of the semiconductor substrate, and on the insulating layer in the boundary region, the first conductivity-type semiconductor layer having a conductivity-type opposite to a conductivity-type of the second conductivity-type semiconductor layer;
    stacking an electrode layer on the first conductivity-type semiconductor layer and the second conductivity-type semiconductor layer; and
    forming a separation groove that separates the electrode layer into a first electrode and a second electrode by removing a part of the electrode layer stacked over an end portion of the first conductivity-type semiconductor layer on the boundary region,
    wherein the separation groove comprises a lateral surface of the first conductivity-type semiconductor layer,
    wherein the first electrode is disposed over the entire first conductivity-type region and across the boundary region,
    wherein the second electrode is disposed over the second conductivity-type region and is separated from the first electrode, and
    wherein the second electrode is not disposed over the first conductivity-type semiconductor layer.

2. The method for manufacturing a photoelectric conversion device of claim 1, wherein the separation groove is formed across the boundary region and the second conductivity-type region.

3. The method for manufacturing a photoelectric conversion device of claim 1, wherein a portion where the separation groove overlaps the second conductivity-type region has a width of 50 μm or less.

4. The method for manufacturing a photoelectric conversion device of claim 1, wherein the formation of the separation groove exposes a portion of the second conductivity-type semiconductor layer.

5. The method for manufacturing a photoelectric conversion device of claim 1, wherein the separation groove is formed only in the boundary region.

6. The method for manufacturing a photoelectric conversion device of claim 1, wherein the insulating layer is disposed so as to cover a lateral surface of the second conductivity-type semiconductor layer.

* * * * *